United States Patent
Scade et al.

(10) Patent No.: US 7,778,098 B2
(45) Date of Patent: Aug. 17, 2010

(54) DUMMY CELL FOR MEMORY CIRCUITS

(75) Inventors: Andreas Scade, Dresden (DE); Stefan Guenther, Dresden (DE)

(73) Assignee: Cypress Semiconductor Corporation, San Jose, CA (US)

( * ) Notice: Subject to any disclaimer, the term of this patent is extended or adjusted under 35 U.S.C. 154(b) by 46 days.

(21) Appl. No.: 12/006,224

(22) Filed: Dec. 31, 2007

(65) Prior Publication Data

US 2009/0168578 A1 Jul. 2, 2009

(51) Int. Cl.
*G11C 7/02* (2006.01)
*G11C 16/04* (2006.01)

(52) U.S. Cl. ............ 365/210.1; 365/185.2; 365/210.11; 365/210.14

(58) Field of Classification Search ............... 365/185.2, 365/210
See application file for complete search history.

(56) References Cited

U.S. PATENT DOCUMENTS

| | | | | |
|---|---|---|---|---|
| 5,163,021 A | * | 11/1992 | Mehrotra et al. | 365/185.03 |
| 5,596,527 A | * | 1/1997 | Tomioka et al. | 365/185.03 |
| 5,608,669 A | * | 3/1997 | Mi et al. | 365/185.03 |
| 5,737,260 A | * | 4/1998 | Takata et al. | 365/145 |
| 5,754,475 A | * | 5/1998 | Bill et al. | 365/185.25 |
| 5,828,601 A | * | 10/1998 | Hollmer et al. | 365/185.2 |
| 5,917,753 A | * | 6/1999 | Dallabora et al. | 365/185.21 |
| 6,026,009 A | * | 2/2000 | Choi et al. | 365/145 |
| 6,058,049 A | * | 5/2000 | Kye et al. | 365/189.09 |
| 6,147,896 A | * | 11/2000 | Kim et al. | 365/145 |
| 6,529,405 B2 | * | 3/2003 | Chang | 365/185.03 |
| 6,584,017 B2 | * | 6/2003 | Maayan et al. | 365/185.22 |
| 6,606,261 B2 | * | 8/2003 | Gudesen et al. | 365/145 |
| 6,639,837 B2 | * | 10/2003 | Takano et al. | 365/185.2 |
| 6,650,570 B2 | * | 11/2003 | Tanzawa et al. | 365/185.22 |
| 6,690,602 B1 | * | 2/2004 | Le et al. | 365/185.33 |
| 6,807,097 B2 | * | 10/2004 | Takano et al. | 365/185.03 |
| 6,906,951 B2 | * | 6/2005 | Wong | 365/185.03 |
| 7,020,037 B2 | * | 3/2006 | Anzai et al. | 365/210.1 |
| 7,054,197 B2 | * | 5/2006 | Vimercati | 365/185.18 |
| 7,092,295 B2 | * | 8/2006 | Iwase et al. | 365/185.28 |
| 7,161,825 B2 | * | 1/2007 | Chow et al. | 365/145 |
| 7,336,532 B2 | * | 2/2008 | Chen | 365/185.03 |
| 7,388,788 B2 | * | 6/2008 | Honda | 365/185.21 |
| 7,397,716 B2 | * | 7/2008 | Honda et al. | 365/210.1 |
| 2003/0117830 A1 | * | 6/2003 | Chow | 365/145 |
| 2004/0088470 A1 | * | 5/2004 | Kawamura et al. | 711/1 |

* cited by examiner

*Primary Examiner*—Son L Mai

(57) ABSTRACT

A memory cell array includes reference cells each associated with a plurality of data cells of the array.

17 Claims, 5 Drawing Sheets

US 7,778,098 B2

DUMMY CELL FOR MEMORY CIRCUITS

TECHNICAL FIELD

The present disclosure relates to memory circuits.

BACKGROUND

To read the value of a digital memory cell it is necessary to determine the logical value represented in the memory cell. Binary cells will store either a logical one, or a logical zero. Typically, the stored value is compared with a fixed reference voltage to determine if it represents a one or a zero. For example, a logical high may be stored when the stored value is above the reference level and the sensing circuitry detects no current flow. A logical low may be stored when the threshold voltage is below the reference level and the sensing circuitry detects current flow.

The reference voltage may be determined from experiments on beginning and end of life situations for the memory cell design, and possibly extrapolation to account for threshold voltage decay due to endurance and retention cycles. The reference voltage may be set once, when the memory system is created, and may be nonadjustable thereafter. These approaches do not reflect the real-world behavior of threshold voltage decay and hence the reference voltage becomes less appropriate over time.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Figure 1:
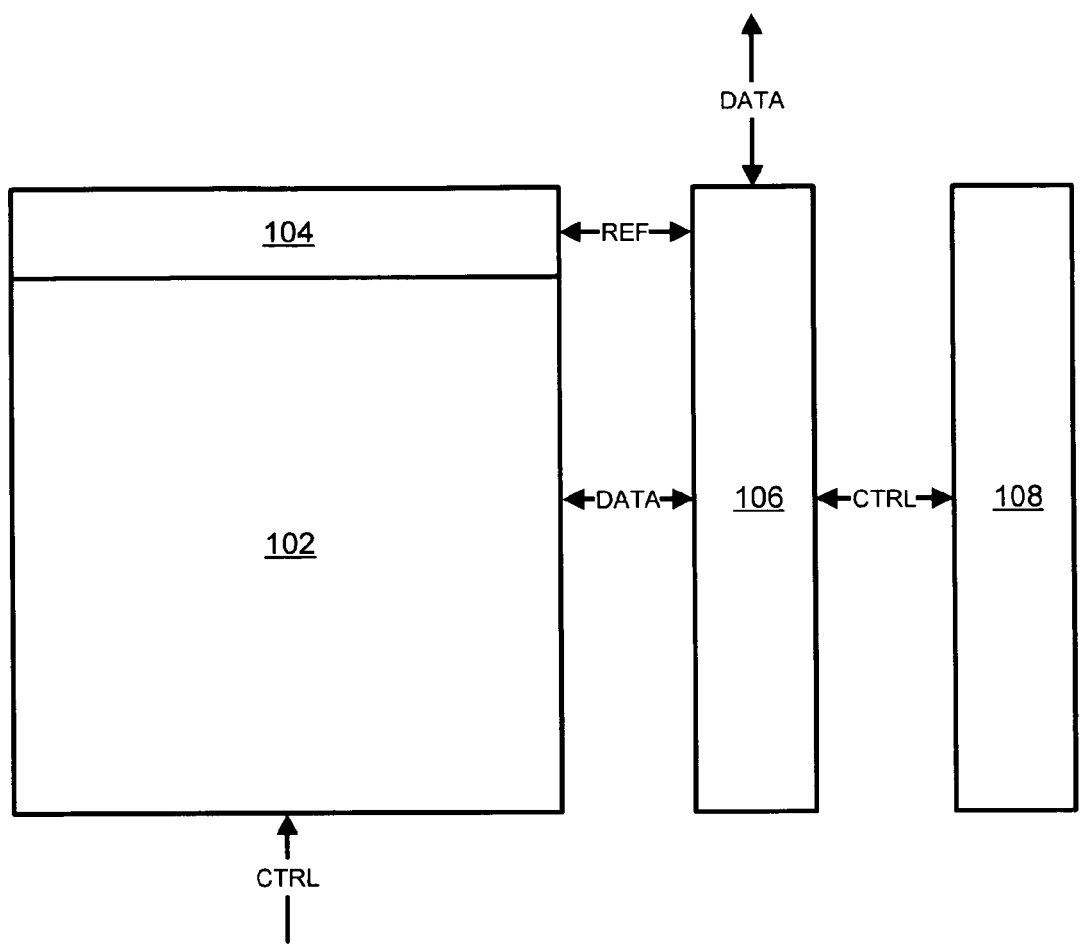
FIGS. 1-4 are block diagrams of embodiments of a memory system including reference cells.

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

Following is a description of a memory system in which reference cells are associated with data cells of a memory array. In particular, two reference cells may be associated with each word line of the memory array. Other implementations may associate more or fewer reference cells with the data cells. Other implementations may associate reference cells with multiple memory words lines or with sets of data cells other than or in addition to memory words lines.

The system may include logic to apply one or more threshold voltage levels to read the reference cells. One reference voltage (V0) may apply to reading logical low (e.g. zero) values, and another reference level (V1) may apply to reading logical high (e.g. one) values. These two reference voltages may in turn be applied to form a reference voltage for reading the data cells of the word line with which the reference cells are associated. Some implementations may apply a single reference voltage level to the reference cells; others may apply more than two. Some implementations may apply more than one reference level to read the data cells. Systems may be designed in which current sensing is used instead of voltage levels; therefore, the term "voltage level" shall be understood to apply to current levels as well.

The terms "reference cell" and "dummy cell" shall be used interchangeably.

The system may include logic to adjust the reference voltage levels when one or more of the values read from the reference cells are inaccurate. For example, if a reference cell is known to store a logical one, and the value read from the cell is zero, the reference voltage V1 used to distinguish logical high values may be adjusted. If a reference cell is known to store a logical zero, and the value read from the cell is one, the reference voltage V0 used to distinguish logical low values may be adjusted. Adjustment of either reference voltage may in turn affect the value of the reference voltage (Vr) applied to the data cells, because the value of Vr may be formed from the values V0 and V1.

The system may include logic to apply memory operations to the reference cells in coordination with operations to corresponding data cells. In this manner, fatigue of the reference cells may occur proportionally to fatigue of the corresponding data cells. In some implementations, the values stored in the reference cells are inverted with each write operation to the corresponding data cells.

The system may include logic to validate values read from data cells when values read from corresponding reference cells are accurate, and to invalidate the values from the data cells otherwise. In this way, not only does the reference voltage to the data cells track fatigue of the cells over time, the tracking also provides a manner of validating the data stored in the system, thereby increasing the system's reliability.

FIGS. 1-4 are block diagrams of embodiments of a memory system including reference cells. In some embodiments, the memory cells art nonvolatile, or combinations of volatile with non-volatile. In some embodiments the memory cells may be volatile. The memory cells may be implemented using various technologies known in the art, for example RAM, DRAM, SRAM, BBSRAM, EEPROM, nvSRAM, SDRAM, nvDRAM, FLASH, and so on.

FIG. 1 shows a system including a memory cell array 102, reference cells 104, read/write logic 106, and control logic 108. Control signals CTRL to the array 102 and reference cells 104 cause data (e.g. a word of bit values) to be read from or written to the array 102. The read/write circuit 106 (e.g. a sense amplifier) may write data from a data bus to the array 102 and may read data from the array to the data bus. Reference values REF may be read from the reference cells 104 to the read/write circuit 106. Control signals CTRL from the control logic 108 to the read/write circuit may operate to adapt a reference voltage for reading bit values from the array 102.

Figure 2:
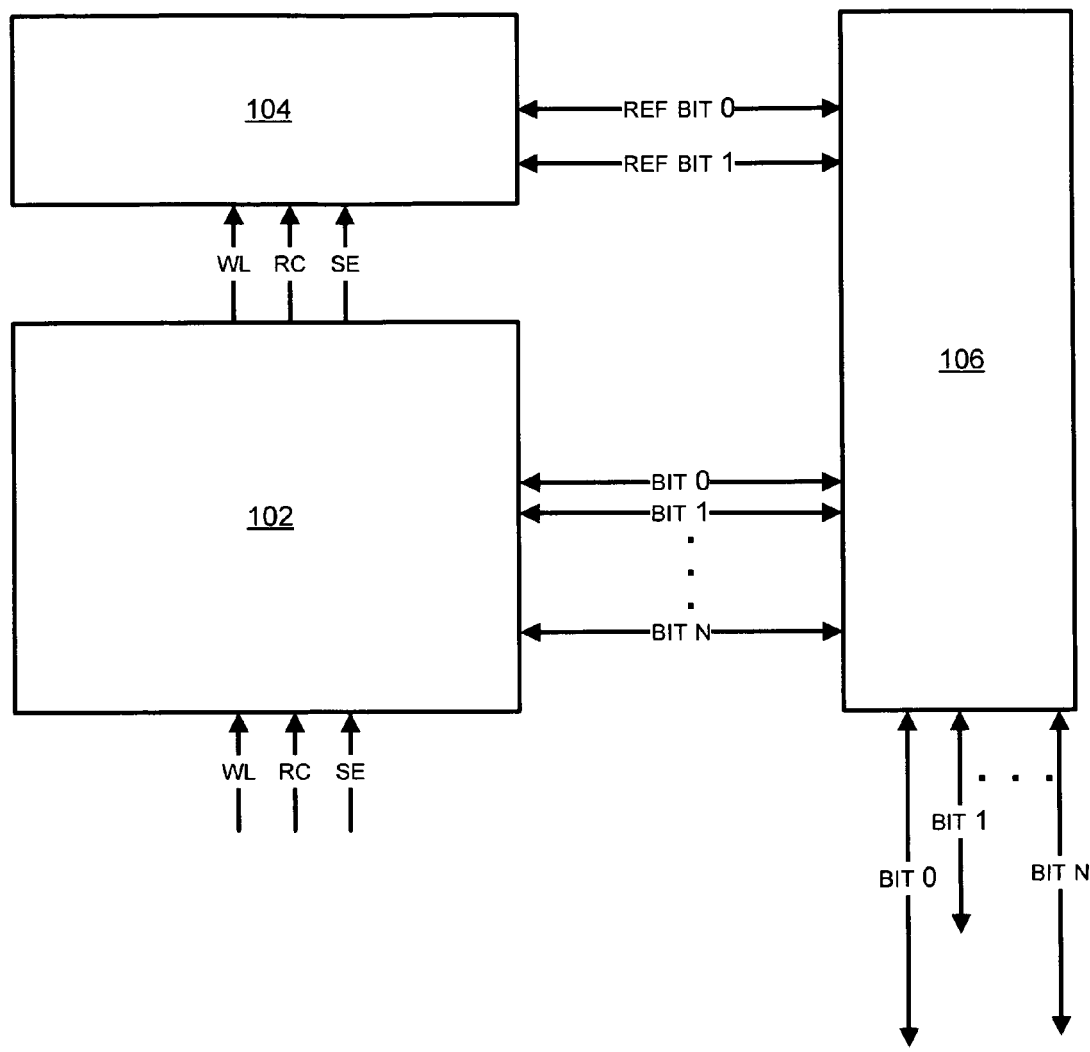

FIG. 2 shows one embodiment of the system in more detail. The control signals to the array 102 may include WL, RC, and SE. This may be the situation, for example, when the array comprises FLASH or combinations of FLASH and DRAM (e.g. nvDRAM). The WL signal may select a row (word line BIT0-BIT N) of bit values from the array 102 for reading by the read/write logic 106, and/or for writing by the read/write logic 106. In some embodiments (e.g. involving FLASH or nvDRAM), when writing to the array 102, the signal SE may be asserted, and for reading from the array 102 the signal RC may be asserted.

In some embodiments, the control signals WL, RC, and SE to the array 102 are also applied to the reference cells 104. This may result in reading/writing of reference values REF BIT 0, REF BIT 1 to and from the reference cells 104. Using common controls for the array 102 and the reference cells 104 may simplify fabrication; both the data array 102, and reference cells 104, may share a common structure and control scheme.

Figure 3:
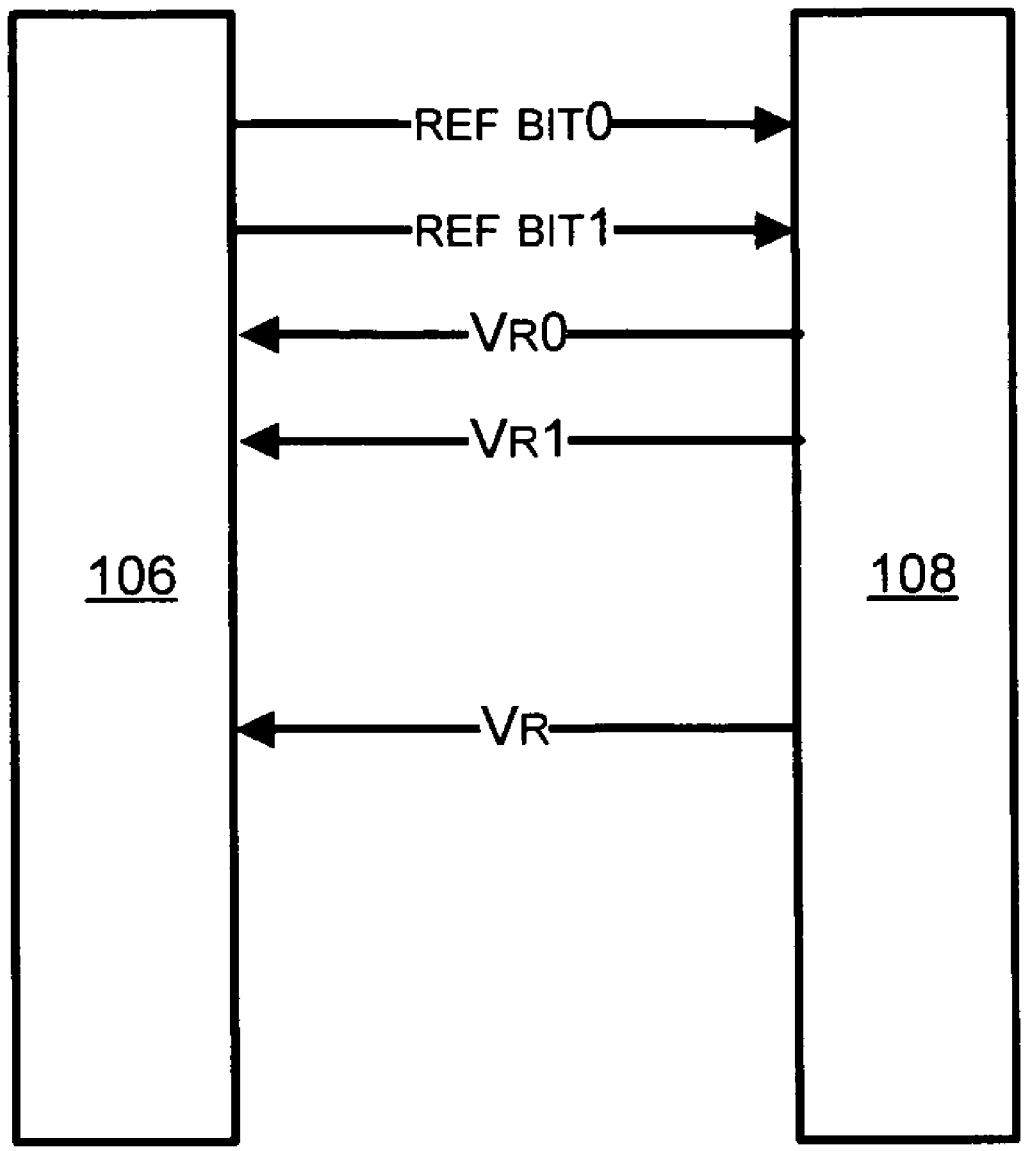

FIG. 3 shows one embodiment of the system in more detail. The read/write logic 106 communicates the reference values REF BIT 0 and REF BIT 1 read from the reference cells to the control logic 108. The control logic 108 provides voltage reference values to the read/write logic 106, as follows: 1) a reference voltage value VR0 for distinguishing low logical levels from the reference cells 104, 2) a reference voltage value VR1 for distinguishing high logical levels from the reference cells 104, and 3) a reference value Vr (VR in the drawings) for distinguishing low and high logical levels from one another in the cell array 102. In many embodiments it will be the case that Vr>V0 and Vr<V1.

Figure 4:
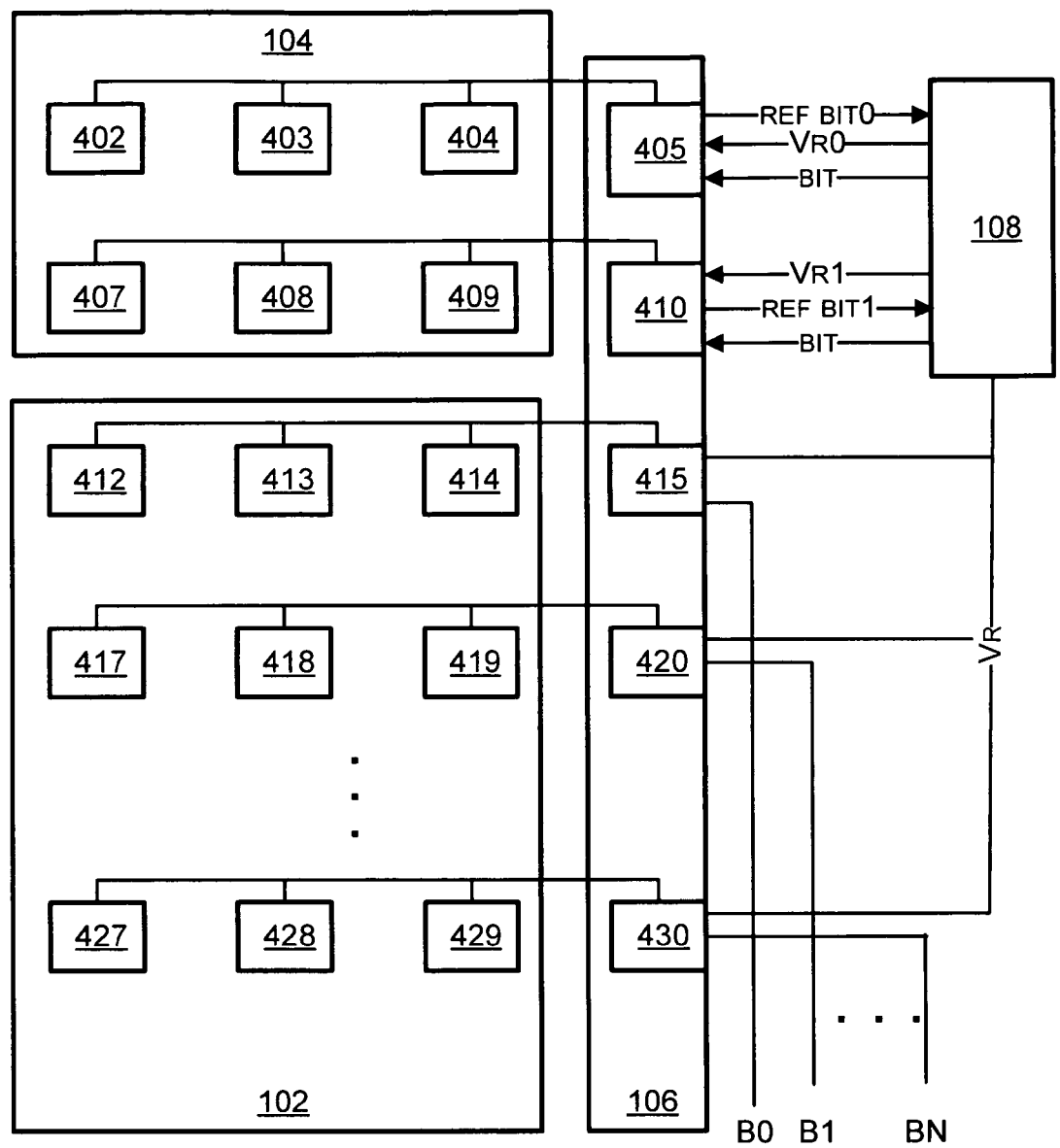

FIG. 4 shows one embodiment of the system in more detail. In this diagram, each row of cells may form a "word line" within the array and may share a set of control signals. For example, the row 402-407-412-417 . . . 427 may share a set of WL, RC, and SE signals.

Data cells in a column share a common "bit line" onto which bit values from the cells are read, and from which bit values are written into the cells. Read/write logic modules 415-420 . . . 430 provide bit values from the data bus B0 . . . Bn for writing part of a word line at a time with new data. The cells in a word line may be READ simultaneously by the read/write logic modules 415-420 . . . 430, which place the selected read bit values onto the data bus B0 . . . Bn.

Reference cells in a column also share a common "reference bit line" onto which bit values from the reference cells are read, and from which bit values are written into the cells. Read/write logic modules 405 and 410 provide bit values (BIT) from the control logic 108 for writing into the reference cells selected by the world line signal WL. The control logic 108 provides reference voltages for distinguishing logical low (VR0) and for distinguishing logical high (VR1). The reference cells 104 store bit values for logical low REF BIT0 and logical high REF BIT1, and may, in some embodiments, be inverted each time the corresponding data cells are written.

Figure 5:
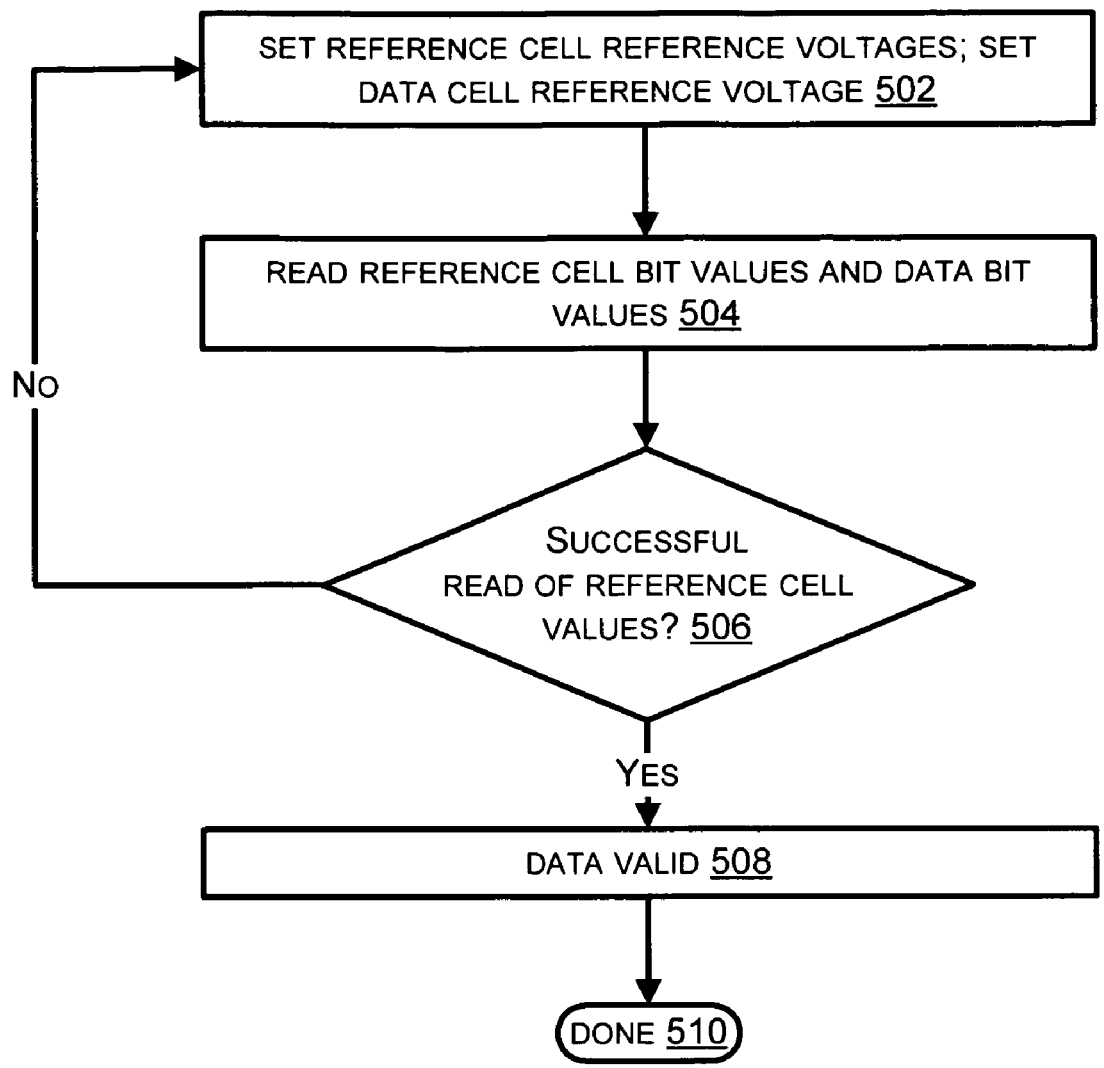
FIG. 5 is a flow chart of an embodiment of a process of reading memory cells using reference cell values.

FIG. 5 is a flow chart of an embodiment of a process of reading memory cells using reference cell values. The reference cell reference voltages (VR0, VR1) are set (502). The values of the reference cell reference voltages also determine the reference voltage (VR) for reading the data cells 102. The reference cell bit values (REF BIT0 and REF BIT1) and the data values from the corresponding data cells are read (504). If the expected reference bit values are received from the reference cells, the values of VR0 and VR1, which were used to determine the reference value VR for reading from the data cells, are properly set, and the corresponding data values that were read may be trusted as valid (506-508).

Otherwise, if the expected reference values are not received from the reference cells, the values of VR0 and VR1, which were used to determine the reference value VR for reading from the data cells, are not properly set, indicating the threshold voltages for cells in that row may have drifted. The data values that were read from that column may be not be trusted as valid (506-502). Thus, the memory array may have reached a point where the threshold voltages of the memory cells have drifted to the point that adjustments are needed. The reference cell reference voltages (VR0, VR1) are adjusted, which adjusts the data cell reference voltage VR, and the READ is attempted again. At 510 the process concludes.

A device may be constructed comprising a memory array in accordance with the embodiments described herein. The device will typically comprise at least one processor, for example a general purpose microprocessor, an embedded special-purpose processor, a digital signal processor, and so on. The processor may interact with a memory array to read and write data during system operation. The memory array may comprise data and reference cells, in accordance with the structures and techniques described herein. In the course of operation, fatigue of the data cells may be tracked by fatigue of the reference cells, and reference voltages for reading bit values stored in the array may be appropriately adjusted.

Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. In so far as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A memory cell array comprising:
   a plurality of reference cells each associated with a plurality of data cells of the array;
   logic to fatigue the reference cells by an amount proportional to a fatigue resulting from memory operations to the associated data cells; and
   logic to apply one or more threshold voltage levels for reading the reference cells and to form at least one reference voltage for reading the data cells based upon the threshold levels for reading the reference cells.

2. The memory cell array of claim 1, wherein the plurality of reference cells each associated with a plurality of data cells of the array further comprises:
   at least one reference cell associated with each word line or part of a word line of data cells in the array.

3. The memory cell array of claim 2, wherein the at least one reference cell associated with each word line or part of a word line of data cells in the array further comprises:
   two reference cells associated with each word line or part of a word line of data cells in the array.

4. The memory cell array of claim 1, wherein the logic to apply one or more threshold voltage levels for reading the reference cells and to form at least one reference voltage for reading the data cells based upon the threshold levels for reading the reference cells further comprises:
   logic to apply a first threshold voltage level for reading a logical high value from the reference cells, to apply a second threshold voltage level for reading a logical low value from the reference cells, and to form a third reference voltage for reading the data cells based upon the first and second threshold voltage levels.

5. The memory cell array of claim 4, wherein the logic to apply a first threshold voltage level for reading a logical high value from the reference cells, to apply a second threshold voltage level for reading a logical low value from the reference cells further comprises:
   logic to adjust one or both of the first threshold voltage level and the second threshold voltage level when one or more of the values read from the reference cells are inaccurate.

6. The memory cell array of claim 1, further comprising:
   logic to apply memory operations to the reference cells in coordination with operations to corresponding data cells, so that fatigue of the reference cells is proportional to fatigue of the corresponding data cells.

7. The memory cell array of claim 6, wherein the logic to apply memory operations to the reference cells in coordination with operations to corresponding data cells further comprises:
   logic to invert the values stored in the reference cells with each write operation to the corresponding data cells.

8. The memory cell array of claim 1, further comprising:
   logic to validate values read from data cells when values read from corresponding reference cells are accurate, and to invalidate the values from the data cells otherwise.

9. A process for reading the values stored in electronic memory data cells, comprising:
   applying at least one reference voltage to at least one reference cell associated with at least one data cells; and
   forming a reference voltage for the at least one data cells from the reference voltage applied to the reference cell(s); and
   applying a memory operation to a data cell; and
   applying an operation to a reference cell corresponding to the data cell, the operation to the reference cell selected to fatigue the reference cell by an amount proportional to a fatigue to the data cell resulting from the memory operation;

reading values from the reference cells; and invalidating values read from the data cells when the values read from the reference cells are not expected values.

10. The process of claim 9, further comprising:

adjusting the at least one reference voltage to the reference cells when the values read from the reference cells are not expected values.

11. The process of claim 9, further comprising:

applying a first threshold voltage level for reading a logical high value from the reference cells, and applying a second threshold voltage level for reading a logical low value from the reference cells.

12. The process of claim 9, further comprising:

applying memory operations to the reference cells in coordination with operations to associated data cells, so that fatigue of the reference cells is proportional to fatigue of the associated data cells.

13. The process of claim 12, further comprising:

inverting the values stored in the reference cells with each write operation to the associated data cells.

14. A device comprising:

at least one processor, and a memory system, the memory system comprising a memory cell array, the array comprising a plurality of reference cells each associated with a plurality of data cells of the array; and logic to fatigue the reference cells by an amount proportional to a fatigue resulting from memory operations to the associated data cells;

logic to apply one or more threshold voltage levels for reading the reference cells and to form at least one reference voltage for reading the data cells based upon the threshold levels for reading the reference cells.

15. The device of claim 14, wherein the plurality of reference cells each associated with a plurality of data cells of the array further comprises:

at least one reference cell associated with each word line or part of a word line of data cells in the array.

16. The device of claim 15, wherein the at least one reference cell associated with each word line of data cells in the array further comprises:

two reference cells associated with each word line of data cells in the array.

17. The device of claim 14, further comprising:

logic to adjust one or both of a first threshold voltage level and a second threshold voltage level to the reference cells when one or more values read from the reference cells are inaccurate.

* * * * *